United States Patent
Lee et al.

(10) Patent No.: US 6,731,540 B2
(45) Date of Patent: May 4, 2004

(54) NON-VOLATILE SEMICONDUCTOR MEMORY DEVICE HAVING SHARED ROW SELECTION CIRCUIT

(75) Inventors: Jin-Yub Lee, Seoul (KR); June Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/222,573

(22) Filed: Aug. 15, 2002

(65) Prior Publication Data

US 2003/0043686 A1 Mar. 6, 2003

Related U.S. Application Data

(60) Provisional application No. 60/315,536, filed on Aug. 28, 2001.

(30) Foreign Application Priority Data

Dec. 21, 2001 (KR) ......................................... 2001-82417

(51) Int. Cl.$^7$ ................................................. G11C 7/00
(52) U.S. Cl. ........................... 365/185.17; 265/185.11; 265/185.12; 265/185.13; 265/185.05; 265/185.18; 265/230.03; 265/230.06

(58) Field of Search .................... 365/185.17, 185.11, 365/185.12, 185.13, 185.18, 185.03, 185.06

(56) References Cited

U.S. PATENT DOCUMENTS

| | | | | |
|---|---|---|---|---|
| 5,467,300 A | * | 11/1995 | Komarek et al. | 365/185.16 |
| 5,861,772 A | | 1/1999 | Lee | |
| 5,963,475 A | * | 10/1999 | Choi et al. | 365/185.11 |
| 5,978,271 A | * | 11/1999 | Sato et al. | 365/185.22 |
| 6,373,753 B1 | * | 4/2002 | Proebsting | 365/189.09 |
| 6,411,548 B1 | * | 6/2002 | Sakui et al. | 365/185.17 |
| 6,532,172 B2 | * | 3/2003 | Harari et al. | 365/185.14 |
| 2002/0118574 A1 | * | 8/2002 | Gongwer et al. | 365/185.28 |

* cited by examiner

Primary Examiner—Viet Q. Nguyen
(74) Attorney, Agent, or Firm—Marger Johnson & McCollom, P.C.

(57) ABSTRACT

A NAND flash memory device includes a first and second memory blocks. A shared row selection circuit is provided between the first and second memory blocks, selectively or simultaneously selecting the first and second memory blocks, and transferring wordline voltages to a selected memory block by means in a multi-boosting manner.

30 Claims, 11 Drawing Sheets

US 6,731,540 B2

NON-VOLATILE SEMICONDUCTOR MEMORY DEVICE HAVING SHARED ROW SELECTION CIRCUIT

RELATED APPLICATION

This application claims priority from the Provisional Application No. 60/315,536 filed Aug. 28, 2001 and Korean Patent Application No. 2001-82417, filed on Dec. 21, 2001, the contents of both of which are herein incorporated by reference in their entirety.

FIELD OF THE INVENTION

This disclosure generally relates to a non-volatile memory device and, more particularly, to a row selection circuit for applying wordline voltages based on each operation mode to wordlines of a selected block.

BACKGROUND OF THE INVENTION

There are growing demands for electrically erasable and programmable semiconductor memory devices in a semiconductor memory device. In addition, such memory devices trend toward higher capacity and integration density. A NAND flash memory device is an example of a non-volatile memory device that can meet higher capacity and integration density without the need to refresh stored data. Since the NAND flash memory device continuously holds data even when a power supply is interrupted, it has widely been used in electronic apparatuses (e.g., portable terminals, handheld computers, cellular phones, digital cameras, etc.).

A conventional NAND flash memory device 10 is illustrated in FIG. 1.

Referring to FIG. 1, a NAND flash memory device includes a memory cell array 20, a row selection circuit (X-SEL) 40, and a sense and latch circuit 60. The memory cell array 20 has a plurality of cell strings (or NAND strings) 21 that are coupled to bitlines BL0–BLm, respectively. The cell string 21 of each column includes a string selection transistor SST serving as a first selection transistor, a ground selection transistor GST serving as a second selection transistor, and a plurality of EEPROM cells MCn (n=0–15) serially connected between the selection transistors SST and GST. The string selection transistor SST of each column has a drain coupled to a corresponding bitline and a gate coupled to a string selection line SSL. The ground selection transistor GST has a source coupled to a common source line CSL and a gate coupled to a ground selection line GSL. Flash EEPROM cells MC15–MC0 are serially connected between a source of the string selection transistor SST and a drain of the ground selection transistor GST. Further, the flash EEPROM cells MC15–MC0 are each coupled to their corresponding wordlines WL15–WL0.

A memory cell array 20 constitutes a memory block and is a so-called "mat". Although only one memory block is illustrated in the figure, a number of memory blocks may be arranged with the same structure as shown in FIG. 1. In this case, the memory blocks are to share bitlines BL0–BLm.

The string selection line SSL, the wordlines WL0–WL15, and the ground selection line GSL are electrically connected to a row selection circuit 40. The row selection circuit 40 selects one of the wordlines WL0–WL15 according to address information, and applies wordline voltages based on each operation mode to a selected wordline and unselected wordlines. This will be explained in detail below. Bitlines BL0–BLm arranged through the memory cell array 20 are electrically connected to the sense & latch circuit 60. The sense and latch circuit 60 senses data from flash EEPROM cells of a selected wordline through the bitlines BL0–BLm in a read operation mode, and applies a power supply voltage or a ground voltage to the bitlines BL0–BLm based on data to be programmed in a program operation mode, respectively.

In a program operation mode, the row selection circuit 40 applies a program voltage Vpgm (e.g., 18V) to a selected wordline and applies a pass voltage Vpass (e.g., 10V) to unselected bitlines. In a read operation mode, the row selection circuit 40 applies a ground voltage GND to a selected wordline and applies a read voltage Vread (e.g., 4.5V) to unselected wordlines. A program voltage, a pass voltage, and a read voltage are higher than a power supply voltage (e.g., 3V). In order to apply a voltage higher than a power supply voltage according to address information, a circuit capable of switching the higher voltage is necessary for the row selection circuit 40. A switch pump scheme or a boosting scheme is used to construct the circuit capable of switching the higher voltage.

A row selection circuit 40 using the switch pump scheme is partially illustrated in FIG. 2.

Referring to FIG. 2, a row selection circuit 40 includes a decoding block 42, a switch pump block 44, and a switch block 46. The decoding block 42 has NAND gates G1 and G2. Address signals DA1–DAi are supplied to the NAND gate G1, and an output signal and a control signal BLK-WLdis are supplied to the NAND gate G2. The control signal BLKWLdis is held high during an erase/program/read operation. The switch pump block 44 is coupled to a BLKWL node (or referred to as "block wordline"), and has a NAND gate G3, a capacitor C1, and NMOS transistors MN1–MN4 that are connected as shown in the figure. The switch block 46 has pass (or transfer) transistors SW1–SW0 each transferring selection signals SS, S15–S0, and GS to their corresponding signal lines SSL, WL15–WL0, and GSL. Gates of the pass transistors SW0–SW17 are commonly coupled to the BLKWL node. The decoding block 42 and the switch pump block 44 constitute a block decoder for selecting a memory block.

When at least one of the address signals DA1–DAi is low, an output signal of the decoding block 42 is made low. In this case, the switch pump block 44 does not perform a pump operation irrespective of a clock signal CLK. On the other hand, when all the address signals DA1–DAi are high, the output signal of the decoding block 42 is made high. In this case, the switch pump block 44 operates based on a low-to-high/high-to-low transition of the clock signal CLK (wherein the low level is a ground voltage level, and the high level is a power supply voltage level). According to the transition of the clock signal CLK, a capacitor C1 repeatedly carries out a charge/discharge operation. If the capacitor C1 is charged by a pumping charge according to the high-to-low transition of the clock signal CLK, the pumping charge is transferred through an NMOS transistor MN1 to increase a voltage of the BLKWL node. When the clock signal CLK then transitions from low to high, a VPP0 voltage (Vread in a read operation, and Vpgm in a program operation) is applied to a gate of the NMOS transistor MN1 through an NMOS transistor MN2 that is shut off by a gate-source voltage difference after predetermined time.

If the capacitor C1 is recharged according to the high-to-low transition of the clock signal CLK, the pumping charge is transferred through the MNOS transistor MN1 to increase a voltage of the BLKWL node. When the clock signal then transition from low to high, the VPP0 voltage is applied to the gate of the NMOS transistor MN1 via the NMOS transistor MN2. As the above procedure is repeated, the voltage of the BLKWL node may be boosted up to "VPP0+Vtn3" finally (wherein the "Vtn3" represents a threshold voltage of an NMOS transistor MN3, and serves to clamp the voltage of the BLKWL node when it is boosted over a required voltage). Therefore, the BLKWL node has a high voltage enough to transfer the program voltage Vpgm/read voltage Vread to a corresponding wordline.

However, a switch pump structure shown in FIG. 2 is not suitable for a low voltage NAND flash memory device. This reason is described below. The clock signal CLK is made low as a power supply voltage is lowered, which means that pumping time required for boosting the voltage of the BLKWL node up to a required voltage becomes elongated. Further, as the pumping operation is carried out, threshold voltages of the NMOS transistors MN1 and MN2 are increased by the body effect. As a result, a voltage level of the BLKWL node is limited by the increased threshold voltage. A row selection circuit using a boosting scheme has been proposed for overcoming disadvantages of the pumping structure.

A circuit diagram of a row selection circuit using a boosting scheme is illustrated in FIG. 3.

Referring to FIG. 3, a row selection circuit 40 includes a decoding block 42', a precharge block 44', a switch block 46', and NMOS transistors MN5, MN10, and MN11. The decoding block 42' has NAND gates G4, G5, and G6. Address signals DA1–DAi are provided to the NAND gate G4. An output signal of the NAND gate G4 and a control signal XDEXdis are provided to the NAND gate G5. An output signal of the NAND gate G5 and a control signal BLKWLdis are provided to the NAND gate G6. In response to a control signal ERSen, the NMOS transistor MN5 transfers the output signal of the NAND gate G5 to a BLKWL node or shuts off the output signal of the NAND gate G5. The control signal BLKWLdis is held high during an erase/program/read operation, and the control signal XDEXdis is held low while the BLKWL node is precharged.

The precharge block 44' is coupled to the BLKWL node and includes NMOS transistors MN6–MN9. Current paths of the MNOS transistors MN6–MN9 are serially formed between a VXPSn voltage and the BLKWL node. Control signals VPREi and VPREj are applied to gates of the NMOS transistors MN6 and MN7, respectively. Diode-coupled NMOS transistors MN8 and MN9 are serially connected between a VXPSn voltage and the BLKWL node. An NMOS transistor MN11 is connected between the BLKWL node and a ground voltage and is turned on/off by an output signal of the NAND gate G6. An NMOS transistor MN10 is connected between an SSLGND node and a string selection line SSL and is turned on/off by the output signal of the NAND gate G6.

The switch block 46' shown in FIG. 3 has the same structure as shown in FIG. 2 and will not be explained in further detail. The decoding block 42', the precharge block 44', and the NMOS transistors MN5, MN10, and MN11 constitute a block decoder circuit. The block decoder circuit and the switch block 46' will repeatedly be present in each memory block so that each memory block may have the same circuit pattern. The SSLGND node has a ground voltage in read and program operations and has a power supply voltage in an erase operation.

When the address signals DA1–DAi applied to the NAND gate G4 are high and the control signal is low, the output signal of the NAND gate G6 is made low. This allows the NMOS transistor MN10 and MN11 to be turned off. Such an operation is performed in a selected memory block. When one of the address signals DA1–DAi applied to the NAND gate G4 is low and the control signal BLKWLdis is high, the output signal of the NAND gate G6 is made high. This allows the NMOS transistors MN10 and MN11 to be turned on. Such an operation is performed in an unselected memory block.

In case of the selected memory block, the BLKWL node is charged to a high voltage VXPSn−Vtn (wherein the "Vtn" represents a threshold voltage of an NMOS transistor). This is because the NMOS transistor MN10 is being turned off when the signals VPREi and VPREj are activated. In case of the unselected memory block, the BLKWL node has a ground voltage because the NMOS transistor MN10 is being turned on. Then, the signals VPREi and VPREj are activated from a high level of a high voltage to a low level of a ground voltage, and the BLKWL node is floated. If selection signals S0–S15 are made high by a high voltage of one of program, pass, and read voltages, a precharged voltage of the BLKWL node is boosted according to a coupling effect caused by a gate capacitor of pass transistors SW0–SW15. Due to the above procedure, the BLKWL node of the selected memory block is charged to the high voltage while the BLKWL node of the unselected memory block is held at a ground voltage. As a result, high voltages of the selection signals S0–S15 are more easily transferred to their corresponding wordline.

However, the block decoder shown in FIG. 3 suffers from disadvantages as follows. As described above, the precharge voltage of the BKWL node becomes "VXPSn−Vtn" in relation with the selected memory block. The threshold voltage "Vtn" is very high, approximately 3V, because a source voltage is boosted. Particularly, the threshold voltage "Vtn" is constant irrespective of a change in a power supply voltage, which imposes a heavy burden on performing a boosting operation under a low voltage. This means that the block decoder circuit show in FIG. 3 is not suitable for the low voltage NAND flash memory device.

Also the control signals VPREi and VPREj are coded according to an address. Memory blocks constituting a memory cell array are divided into a plurality of groups. The same control signals are to be provided to each of the groups. Control signals applied to a selected group are activated, while the control signals applied to unselected groups are inactivated. The activated control signals VPREi and VPREj have a high voltage in order to transfer a VXPSn voltage to the BLKWL node. This means that a circuit for applying a high voltage to the activated control signals VPREi and VPREj, i.e., a switch pump circuit is demanded. An example switch pump circuit is disclosed in U.S. Pat. No. 5,861,772 entitled "CHARGE PUMP CIRCUIT OF NONVOLATILE SEMICONDUCTOR MEMORY". As memory blocks constituting a memory cell array increase in number, memory block groups also increase in number. This means increase in number of the control signals that must be applied to memory block groups. Therefore, because more switch pump circuits for applying a high voltage to control signals are demanded, they restrict the layout to increase a chip size. If a high voltage control signal is commonly applied to all blocks without a coding procedure in order to overcome the size restriction, the switch pump circuits see the BLKWL nodes of all the blocks. Thus, a loading capacitor is so large that precharge time becomes longer.

SUMMARY OF THE INVENTION

In view of the foregoing, embodiments of the present invention provide a non-volatile memory device having a row selection circuit that is shared by adjacent memory blocks. Further, embodiments of the present invention provide a non-volatile memory device having a row selection circuit capable of being formed with a high integration density.

DESCRIPTION OF THE PREFERRED EMBODIMENTS

Figure 4:
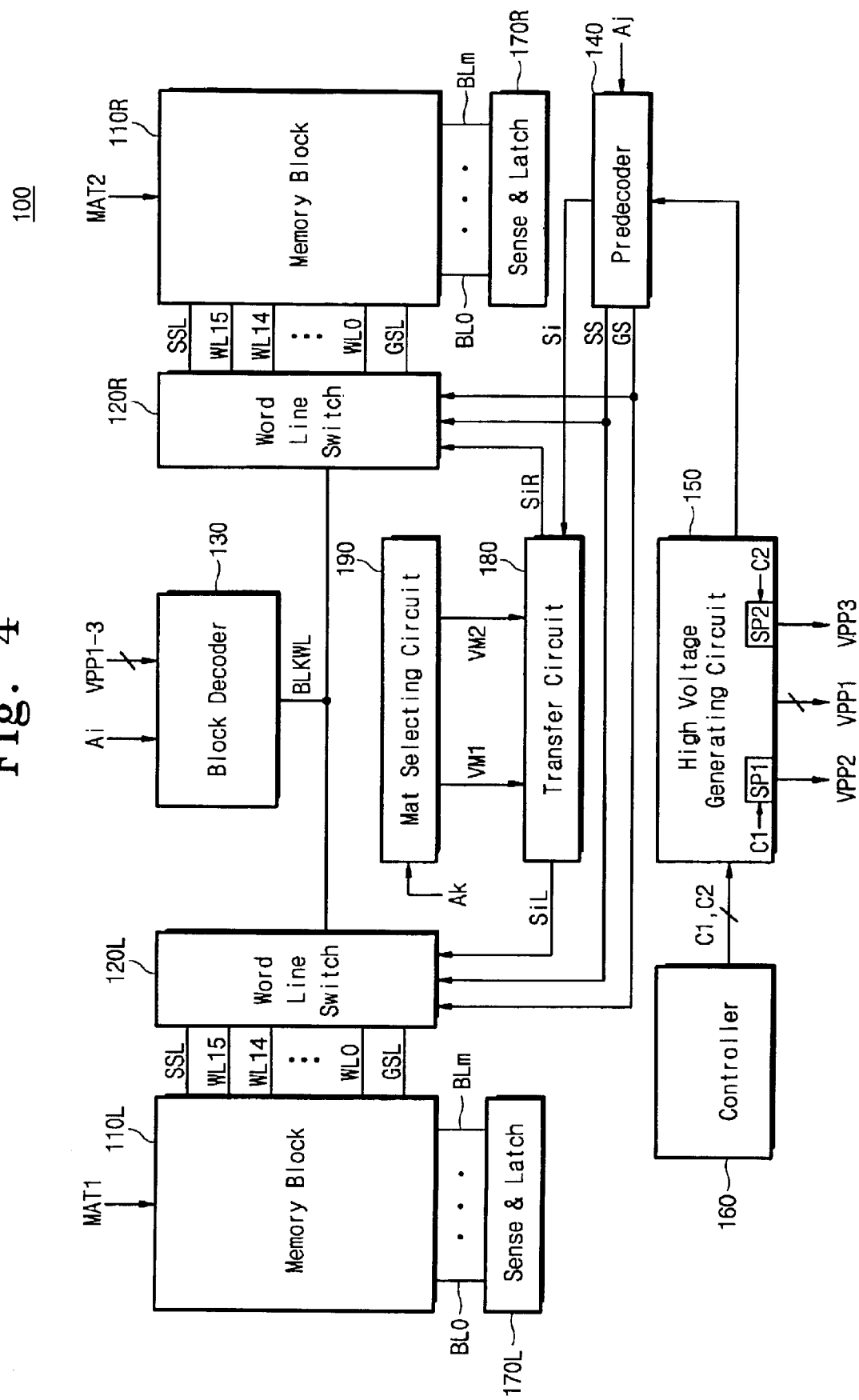
FIG. 4 is a block diagram of a NAND flash memory device according to an embodiment of the present invention.

FIG. 4 shows a NAND flash memory device according to an embodiment of the present invention.

Figure 1:
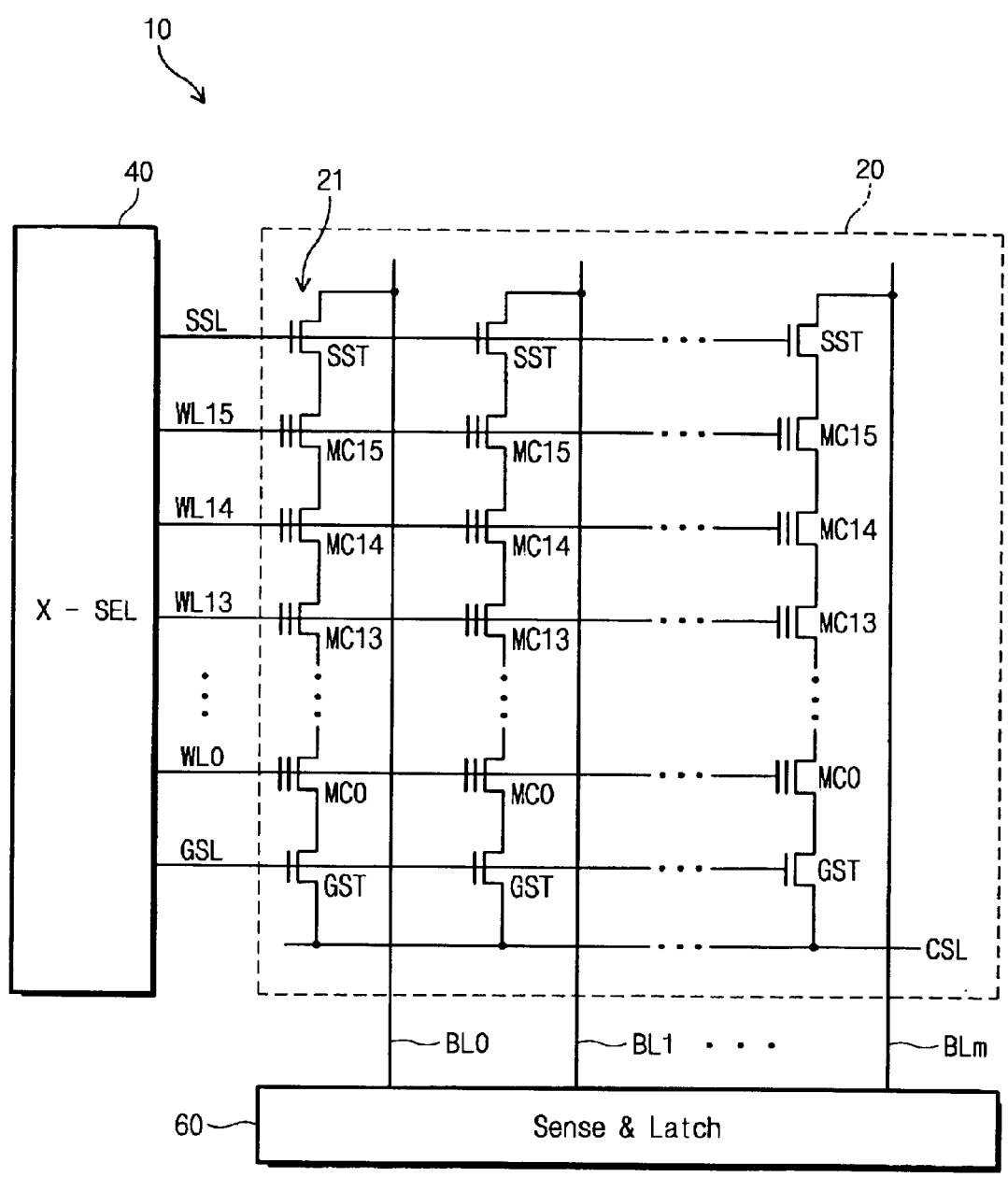
FIG. 1 shows an array structure of a conventional NAND flash memory device.
Figure 2:
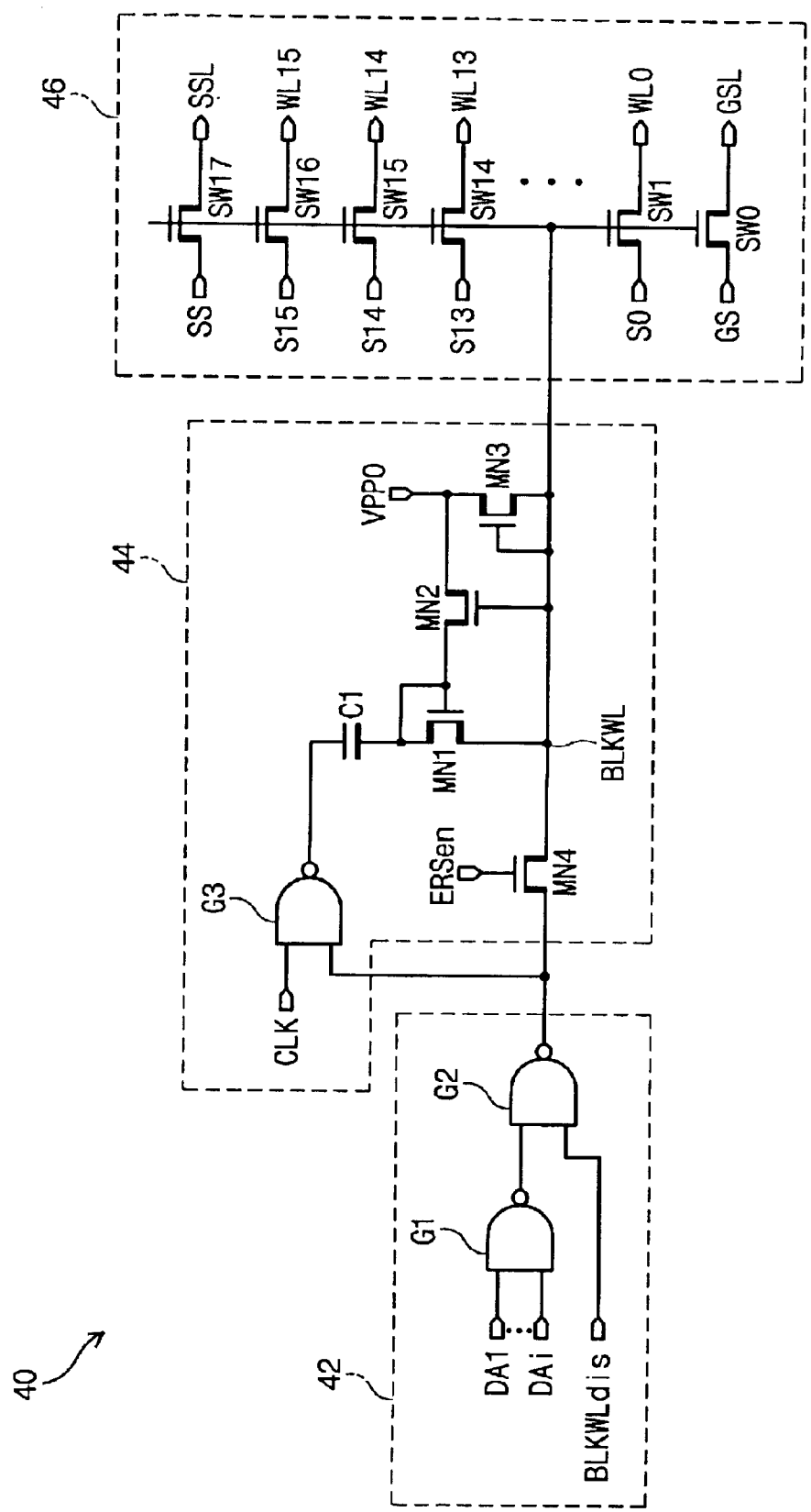
FIG. 2 shows an example of a row selection circuit shown in FIG. 1.

Referring to FIG. 4, a NAND flash memory device 100 includes a first memory block 110R constituting a first mat (or first memory cell array) and a second memory block 110L constituting a second mat (or second memory cell array). Although not shown in the figure, first and second mats MAT1 and MAT2 may have more memory blocks, respectively. The first and second memory blocks 110R and 110L include a plurality of cell strings each being constructed as shown in FIG. 1. A row selection circuit is interposed between the first and second blocks 110R and 110L. The row selection circuit has first and second wordline switch blocks 120R and 120L and a block decoder 130. The row selection circuit is shared by adjacent memory blocks of the first and second mats MAT1 and MAT2.

A string selection line SSL, wordlines WL15–WL0, and a ground selection line GSL, which are arranged along rows of the first memory block 110R, are electrically connected to a first wordline switch block 120R. According to a signal on a block wordline BLKWL from a block decoder 130, the first wordline switch block 120R transfers selection signals SiR (i=0–15) from a transfer circuit 180 and selection signals SS and GS from a predecoder 140 to their corresponding signal lines SSL, WL0–WL15, and GSL, respectively. A string selection line SSL, wordlines WL15–WL0, and a ground selection line GSL, which are arranged along rows of the second memory block 110L, are electrically connected to a second wordline switch block 120L. According to the signal on the block wordline BLKWL from the block decoder 130, the second wordline switch block 120L transfers selection signals SiL (i=0–15) from the transfer circuit 180 and selection signals SS and GS from the predecoder 140 to their corresponding signal lines SSL, WL0–WL15, and GSL, respectively. The block decoder 130 is controlled by a write/read controller 160 and activates/ inactivates the block wordline BLKWL according to address information Ai for addressing a memory block. This will be explained in detail below.

In response to the address information Ai for selecting one of wordlines arranged in each memory block, the predecoder 140 outputs the selection signals SS, S0–S15, and GS. In a read operation, the selection signals SS and GS have a power supply voltage VCC, one of the selection signals S0–S15 has a ground voltage GND, and the other selection signals have a read voltage Vread. In a program operation, the selection signal SS has a power supply voltage VCC and the selection signal GS has a ground voltage GND. Also, in the program operation, one of the selection signals S0–S15 has a program voltage Vpgm and the other selection signals have a pass voltage Vpass. The predecoder 140 receives the program voltage Vpgm, the pass voltage Vpass or the read voltage Vread from a high voltage generating circuit 150 in order to transfer a high voltage to selection signals Si (i=0–15).

According to the control of a write/read controller 160, the high voltage generating circuit 150 transfers high voltages VPP1, VPP2, and VPP3 to the block decoder and transfers a program voltage Vpgm, a pass voltage Vpass, and a read voltage Vread, as wordline voltages, to the predecoder 140. According to control signals C1 and C2 from the write/read controller 160, the high voltages VPP2 and VPP3 are outputted from switch pumps SP1 and SP2 of a high voltage generating circuit 150, respectively. For example, when the control signal C1 is high, the switch pump SP1 outputs a high voltage VPP2. When the control signal C1 is low, the switch pump SP1 outputs a ground voltage GND. Similarly, when the control signal C2 is high, the switch pump SP2 outputs a high voltage VPP3. When the control signal C2 is low, the switch pump SP2 outputs a ground voltage GND. The switch pumps SP1 and SP2 may be realized using those taught in the above-mentioned U.S. Pat. No. 5,861,772 or other switch pumps, although not shown in the figure. Since the high voltage VPP1 is not switched, a switch pump circuit for the high voltage VPP1 is not needed.

Still referring to FIG. 4, bitlines BL0–BLm along each row of the first and second memory blocks 110R and 110L are electrically connected to corresponding sense & latch circuits 170R and 170L. Each of the sense & latch circuits 170R and 170L senses data from flash EEPROM cells of a selected wordline via bitlines BL0–BLm in a read operation mode and supplies a ground voltage VCC or a ground voltage GND to the bitlines BL0–BLm according to data to be programmed in a program operation mode, respectively. The transfer circuit 180 receives the selection signals S0–S15 from the predecoder 140 and outputs first selection signals S0R–S15R or second selection signals S0L–S15L in response to control signals VM1 and VM2 from a mat selection signal 190. Output signals from the mat selection circuit 190 have the same voltages as input signals therefrom. The mat selection circuit 190 outputs the control signals VM1 and VM2 in response to address information Ak for addressing a mat. The control signals VM1 and VM2 may be activated exclusively or simultaneously. That is, one of mats is selected according to the address information Ak or all mats are selected according to the address information Ak.

Although one memory block is illustrated in the figure, it will be understood that a plurality of memory blocks are further provided so as to share the bitlines BL0–BLm. If each of the mats has a plurality of memory blocks, a wordline switch block and a block decoder may be further fabricated to correspond to each of the memory blocks. If each of the mats has a plurality of memory blocks, a block decoder structure shown in FIG. 3 requires a number of switch pump circuits (e.g., 10 or more switch pump circuits) decided by address coding so as to receive the high voltages VPREi and VPREj. On the other hand, in the present invention, because the high voltages VPP1, VPP2, and VPP3 are simultaneously applied to all the block decoders, only two switch pump circuits are demanded without addressing coding. This means that the NAND flash memory device according to the invention is advantageous to form circuits having high integration density.

Figure 5:
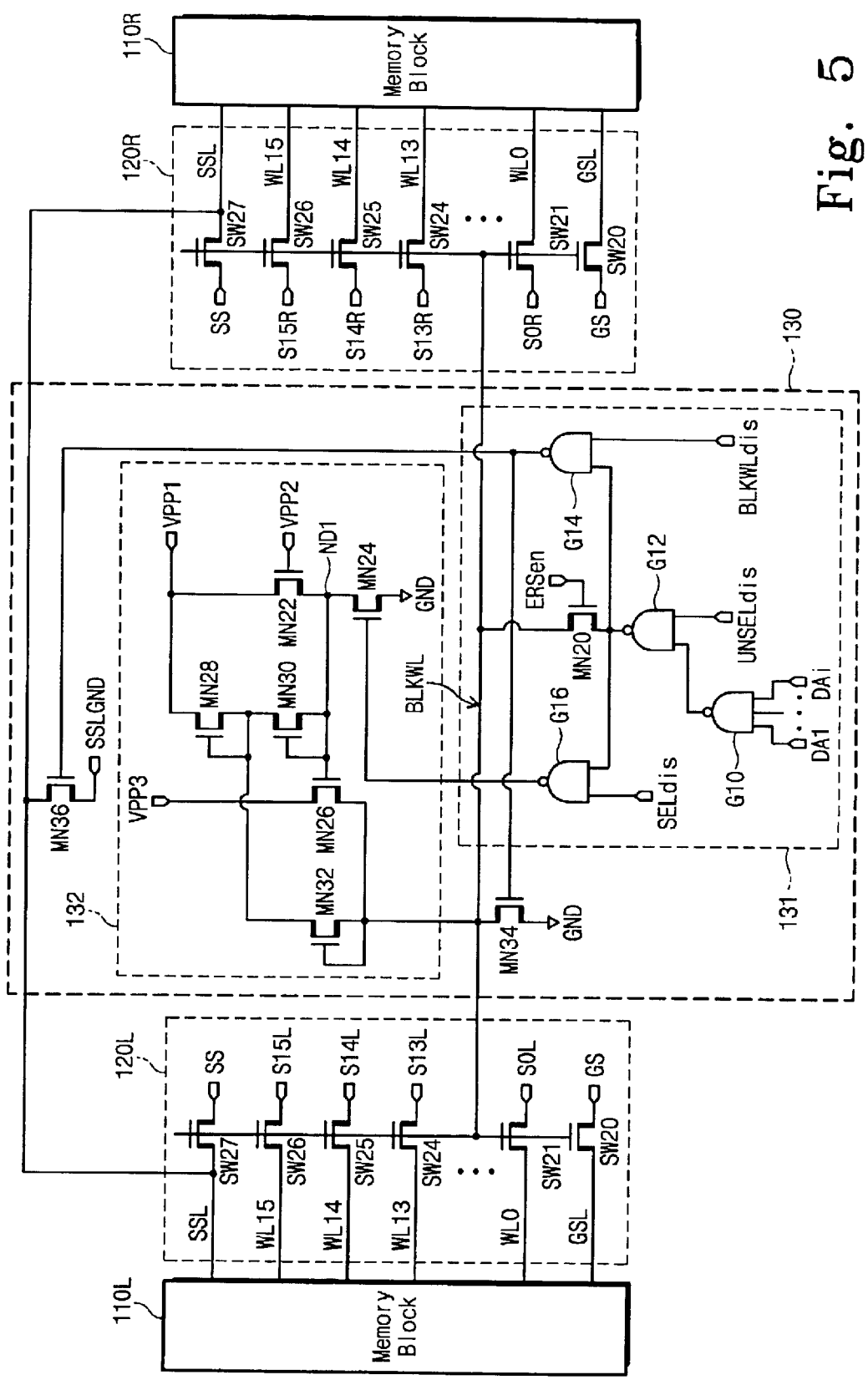
FIG. 5 shows an embodiment of a block decoder and a switch block shown in FIG. 4.

An example embodiment of the block decoder 130 and the wordline switch block 120 of FIG. 4 is illustrated in FIG. 5. A first wordline switch block 120R includes pass transistors SW27–SW20 each corresponding to their selection signals SS, S15R–S0R, and GS. Gates of the pass transistors SW27–SW20 are commonly connected to a block wordline BLKWL. The selection signals SS, S15R—S15R, and GS are transferred to a string selection line SSL, wordlines WL15–WL0, and a ground selection line GSL via the pass transistors SW27–SW20, respectively. During a read operation, one of the selection signals S15R–S0R has a ground voltage VSS and the others thereof have a read voltage Vread. During a program operation, one of the selection signals S15R–S0R has a program voltage Vpgm and the others thereof have a pass voltage Vpass. The pass transistors SW20–SW27 of the first wordline switch block 120R include an NMOS transistor for a high voltage.

A second wordline switch block 120L includes pass transistors SW27–SW20 each corresponding to their selection signals SS, S15L–S0L, and GS. Gates of the pass transistors SW27–SW20 are commonly connected to the block wordline BLKWL. Selection signals SS, S15L–S0L, and GS are transferred to a string selection line SSL, wordlines WL15–WL0, and ground selection line GSL via the pass transistors SW27–SW20, respectively. During a read operation, one of the selection signals S15L–S0L has a ground selection voltage VSS and the others thereof a read voltage Vread. During a program operation, one of the selection signals S15L–S0L has a program voltage Vpgm and the others thereof have a pas voltage Vpass. The pass transistors SW20–SW27 of the second wordline switch block 120L include an NMOS transistor for a high voltage.

Still referring to FIG. 5, an output of a block decoder 130 is coupled to the block wordline BLKWL and includes a decoding block 131, a precharge block 132, and NMOS transistors MN34 and MN36. The decoding block 131 includes NAND gates G10, G12, G14, and G16. Address information DA1–DAi for addressing a memory block are signals decoded in a transfer terminal (not shown) and is provided to the NAND gate G10. An output signal of the NAND gate G10 and a control signal UNSELdis are provided to the NAND gate G12. An output signal of the NAND gate G10 is used as a block selection signal (or block selection information). An output signal of the NAND gate G12 and a control signal BLKWLdis are provided to the NAND gate G14. An output signal of the NAND gate G14 and a control signal SELdis are provided to the NAND gate G16. An NMOS transistor MN20 is connected between the block wordline BLKWL and the NAND gate G12 and is turned on/off by a control signal ERSen. The control signal ERSen is low in a program/read operation and is high in an erase operation.

An NMOS transistor MN34 is connected between the block wordline BLKWL and the ground voltage GND and is turned on/off by an output signal of the NAND gate G14. The NMOS transistor MN34 is used to discharge the block wordline BLKWL. An NMOS transistor MN36 is shared by adjacent memory blocks 110R and 110L and is connected between the string selection lines SSL and an SSLGND node. The NMOS transistor MN36 is turned on/off by the output signal of the NAND gate G14. The SSLGND node has a ground voltage in a program/read operation and has a power supply voltage VCC in an erase operation. To prevent a string selection line SSL of an unselected memory block from floating in a program/read operation, the NMOS transistor MN36 provides a ground voltage GND to the string selection line SSL of the unselected memory block in the program/read operation. When a block selection signal (an output signal of the NAND gate G10) is activated, the NMOS transistor MN36 is turned off. When the block selection signal (the output signal of the NAND gate G10) is inactivated, the NMOS transistor MN36 is turned on.

The precharge block 132 is coupled to the block wordline BLKWL and includes NMOS transistors MN22, MN24, MN28, MN30, and MN32. The NMOS transistor MN22 has a current path connected between a high voltage VPP1 and an ND1 node, and a gate coupled to a high voltage VPP2. The NMOS transistor MN24 whose gate is coupled to an output terminal of the NAND gate G16, is coupled between the ND1 node and the ground voltage GND. The NMOS transistor MN26 is coupled between a high voltage VPP3 and the block wordline BLKWL and has a gate coupled to the ND1 node. The diode-coupled NMOS transistors MN28 and MN30 are serially connected between the high voltage VPP1 and the ND1 node. The diode-coupled NMOS transistor MN32 is connected between the block wordline BLKWL and a gate of the NMOS transistor MN28. The NMOS transistors MN28 and MN30 constitute a clamp circuit for preventing a voltage of the ND1 node from increasing over a required voltage. NMOS transistors used in the precharge block 132 include a high voltage transistor.

Figure 6:
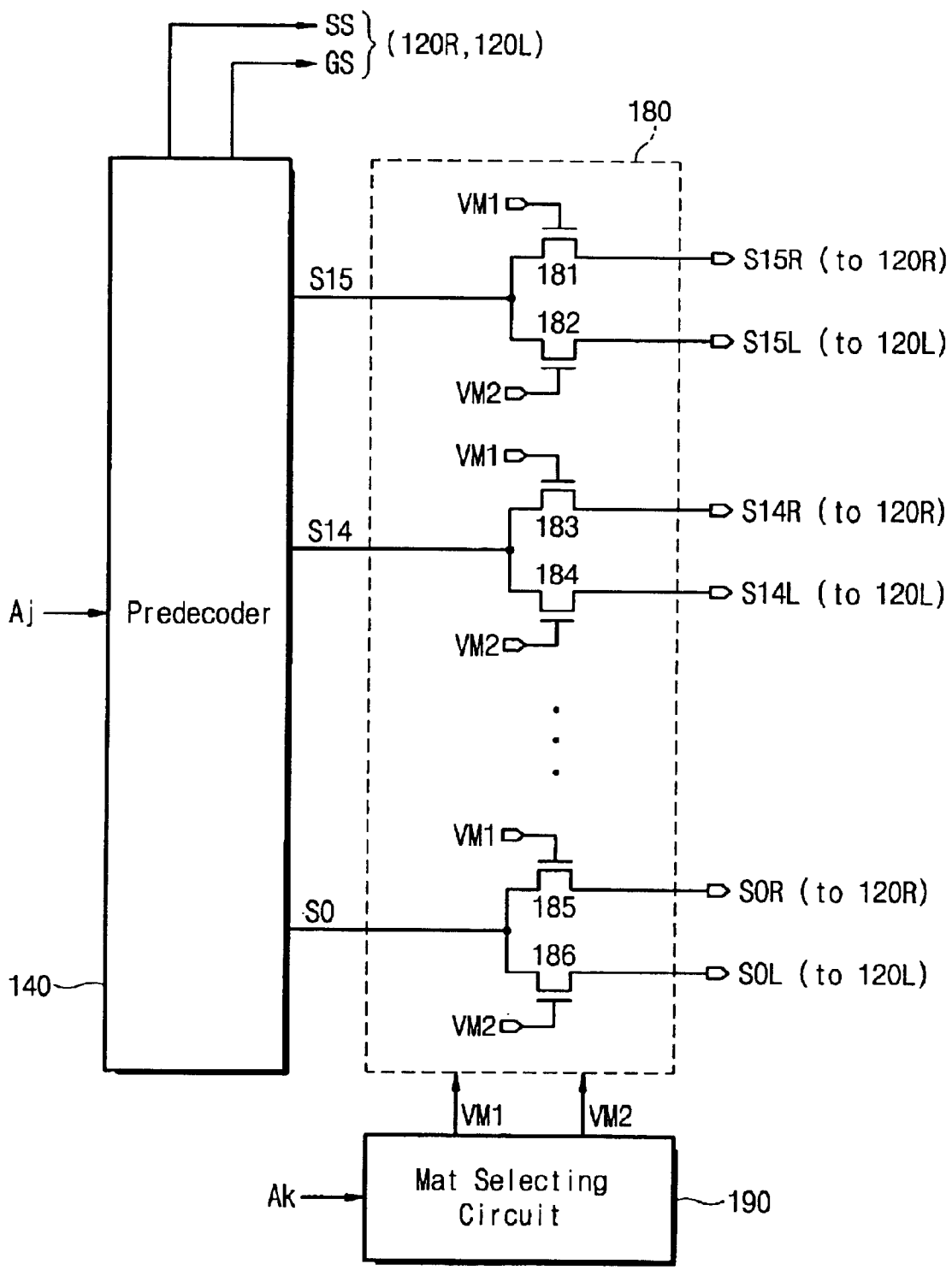
FIG. 6 shows an embodiment of a transfer circuit shown in FIG. 4.

An embodiment of the transfer circuit 180 of FIG. 4 is illustrated in FIG. 6. A transfer circuit 180 receives selection signals S0–S15 outputted from a predecoder 140 and outputs first selection signals S0R–S15R or second selection signals S0L–S15L in response to control signal VM1 and VM2 from a mat selecting circuit 190. A switch circuit 180 corresponds to the selection signals S0–S15, respectively, and includes transistors 182, 184, . . . , and 186 that are commonly controlled by the control signal VM2.

If a first memory block 110R of a first mat MAT1 is selected, a mat selection circuit 190 activates the control signal VM1. This allows the output signals S0–S15 of the predecoder 140 to be outputted as selection signals S0L–S15L applied to a switch block 120L. If the first and second memory blocks 110R and 110L are simultaneously selected, the mat selection circuit 190 simultaneously activates the control signals VM1 and VM2. This allows the output signals S0–S15 of the predecoder 140 to be outputted as first and second selection signals S0R–S15R and S0L–S15L applied to the first and second switch blocks 120R and 120L. That is, two wordlines are simultaneously selected.

Figure 7:
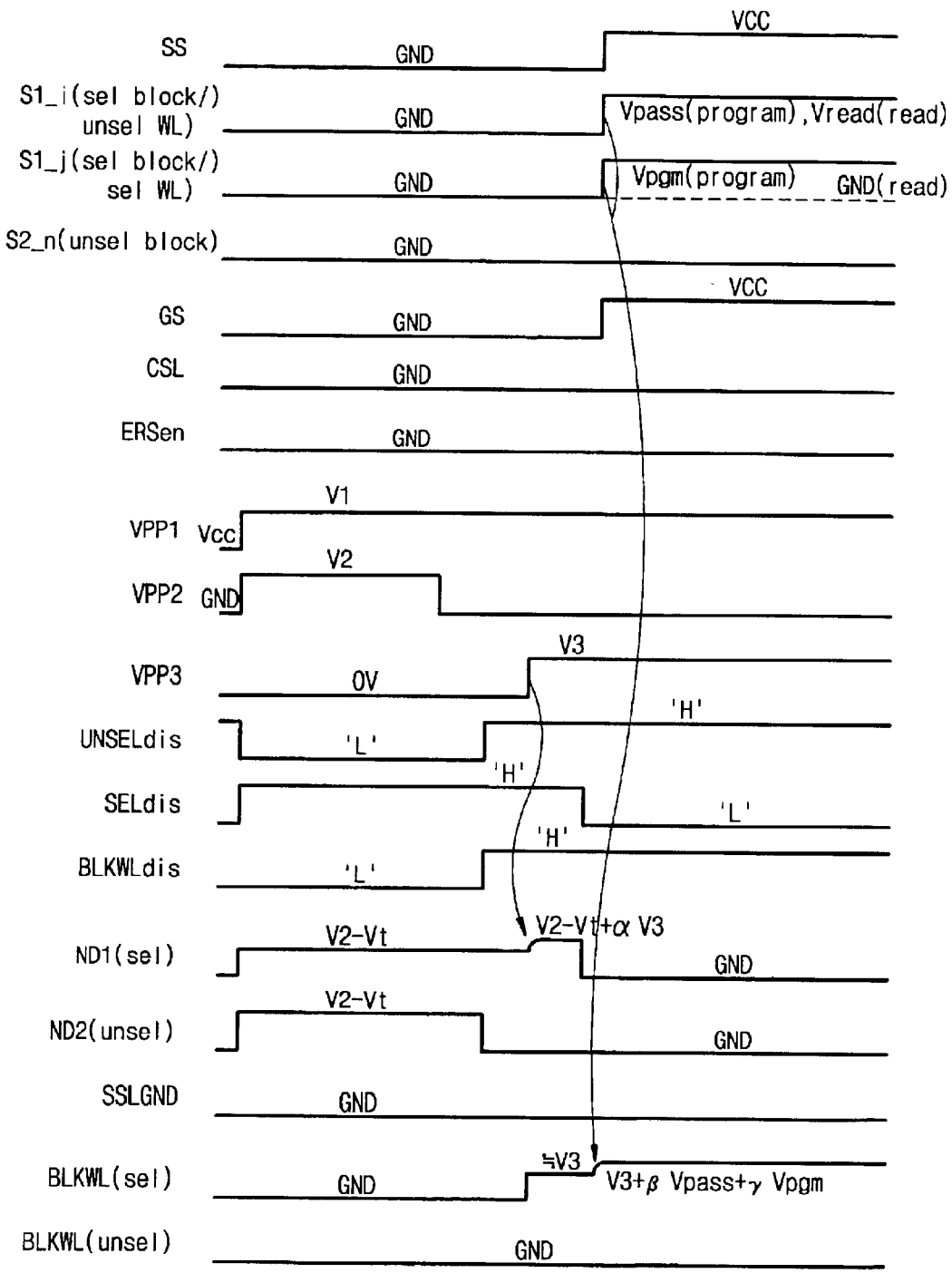
FIG. 7 is a timing view for explaining operations of a NAND flash memory device shown in FIG. 4.

A timing diagram for explaining operations of a NAND flash memory device based on a program/read operation mode is illustrated in FIG. 7. A block decoder 130 and a row selection circuit including wordline switch blocks 120R and 120L operate identically in program and read operation modes except that their wordline voltages applied to their wordlines are different from one another. For that reason, an operation of providing wordline voltages to a selected memory block via a row selection circuit will be explained in detail later. After the wordline voltages are provided, practical program and sense operations are well known in the art and will not be further explained in further detail.

As well known to a person skilled in the art, in case of a NAND flash memory device, a command indicating successive data input is inputted in a program operation mode. An address including mat, block, and wordline selection information is provided to an address memory device. According to the inputted address, a memory block of any mat is selected. Corresponding wordlines voltages are applied to wordlines of the selected memory block. After the address is inputted, data to be programmed in the selected memory block is loaded on a sense & latch block. For the sake of convenience, assuming that data is programmed in a memory block 110R of a first mat MAT1.

Under the assumption, an ND1 node of a precharge block 132 is precharged to "V2−Vtn" via an NMOS transistor MN22 (wherein the "Vtn" represents a threshold voltage of the NMOS transistor MN22). More specifically, a high voltage VPP1 is boosted from a power supply voltage VCC to a high voltage level V1 and a high voltage VPP2 is boosted from a ground voltage GND to a high voltage level V2. In this case, a lower control signal UNSELdis is made low and a control signal SELdis is made high. Irrespective of address information DA1−DAi, this allows an output signal of an NAND gate G12 in a decoding block 131 to be made high and an NMOS transistor MN24 is turned off. Therefore, the ND1 node is precharged to the "V2−Vtn". Such a precharge operation is concurrently performed in memory blocks constituting a selected mat irrespective of address coding.

If an ND1 node of the respective block decoders of the selected mat is precharged, the ground voltage GND, instead of the high voltage V2, is applied to the input terminal VPP2 so that charges precharged in the ND1 node cannot be discharged. A voltage of an ND1 node associated with the other memory blocks (i.e., unselected memory blocks) except the selected memory block is discharged by way of the following procedure. When the address signals DA1−DAi are all high, a memory block is selected. When at least one of the address signals DA1−DAi is low, any memory block is not selected. If the control signals UNSELdis and SELdis are high, a NAND gate G16 of a decoding block 131 associated with a selected memory block outputs a low level signal to turn off the NMOS transistor MN24. Therefore, the charges precharged in the ND1 node are maintained. That is, the ND1 node precharged to the "V2−Vtn" maintains a floating state in relation with the selected memory block. On the other hand, an NAND gate G16 of a decoding block 131 associated with an unselected memory block outputs a high level signal to turn on the NMOS transistor MN24. Therefore, the charges precharged in the ND1 node are discharged via the NMOS transistor MN24. That is, the ND1 node has a ground voltage in relation with the unselected memory block.

Under such a bias condition, when a high voltage VPP3 (=V3) from a high voltage generation circuit 150 is applied to a precharge block 132 of a selected memory block, a precharged voltage of an ND1 node of the selected memory block is boosted. The boosted voltage becomes "V2−Vtn+ αV3", which is higher than a high voltage V3. This means that the high voltage V3 is transferred to a block wordline BLKWL without a voltage loss (i.e., corresponding to a threshold voltage of an NMOS transistor MN26). In this case, the ND1 node of the unselected memory block is held at the ground voltage GND. The above-described operation is called "a first boosting operation".

A voltage change of the ND1 node is obtained by multiplying a coupling ratio ($\alpha$) by a high voltage VPP3. The coupling ratio ($\alpha$) is given by "Cg2/(Cg2+Cp)", wherein the "Cg2" represents a gate capacitance of the NMOS transistor MN26 and the "Cp" represents a parasitic capacitance that is equal to a "Cg2"-free total capacitance commonly connected to the ND1 node. In order to transfer the high voltage VPP3 to the block wordline BLKWL without the voltage loss, it is very significant to set a coupling ratio and an initial level (i.e., a precharge voltage of an ND1 node; V2−Vtn) by means of simulation. If a voltage of the ND1 node is over-boosted, breakdown may occur.

The control signal SELdis then transitions from high to low, as shown in FIG. 7. This allows the voltage of the ND1 node of the selected memory block to be discharged. The high-to-low transition of the control signal SELdis is made for preventing a voltage boosted by a subsequent boosting operation from being discharged via the NMOS transistor MN26. As a result of the first boosting operation, a block wordline BLKWL associated with the selected memory block is charged to the high voltage V3 and a block wordline BLKWL associated with the unselected memory block is held at the ground voltage GND. The block wordline BLKWL associated with the selected wordline is floated because the NMOS transistor MN26 is shut off.

According to the foregoing assumption, a mat selection circuit 190 activates a control signal VM2. This allows signals S0−S15, as selection signals S0R−S15R, from a transfer circuit 180 to be transferred to a first wordline switch block 120R. When the selection signals S0R−S15R from the transfer circuit 180 are respectively applied to pass transistors SW21−SW26 of the first wordline switch block 120R, the voltage V3 of the block wordline BLKWL is boosted by the same operation as the first boosting operation (a second boosting operation). This is because the block wordline BLKWL maintains a floating state. The boosted voltage of the block wordline BLKWL becomes "V3+ βVpass+γVpgm". Here, the coupling ratio ($\beta$) is given as "(n−1)Cg/nCg+Cp" (wherein the "Cg" represents a gate capacitance of each pass transistor, the "(n−1)" represents the number of wordlines (or pass transistors) that receives a pass voltage Vpass, and "n" represents the number of pass transistors that are coupled to wordlines, respectively). Alternatively, the coupling ratio ($\beta$) may be give as "Cg/ (nCg+Cp)" (wherein the "Cp" represents a Cg-free total capacitance).

As a voltage of the block wordline BLKWL is boosted to the "V3+βVpass+γVpgm", high voltages (e.g., a program voltage, a pass voltage or a read voltage) of the selection signals S0R−S15R are transferred to corresponding wordlines WL0−WL15 via pass transistors SW21−SW26, respectively. A practical program/read operation will be performed by means of a manner well known in the art. After the practical program/read operation, the voltage of the block wordline BLKWL is discharged via an NMOS transistor MN34 by high-to-low transition of the control signal BLKWLdis.

As explained above, a string selection line SSL of an unselected memory block is grounded via the NMOS transistor MN36 during the program/read operation. That is, the NMOS transistors MN34 and 36 are turned on because an output signal of the NAND gate G12 is held low in a block decoder associated with the unselected memory block. Therefore, in relation with the unselected memory block, the block wordline BLKWL and the string selection line SSL is held at a ground voltage in the program/read operation.

Figure 3:
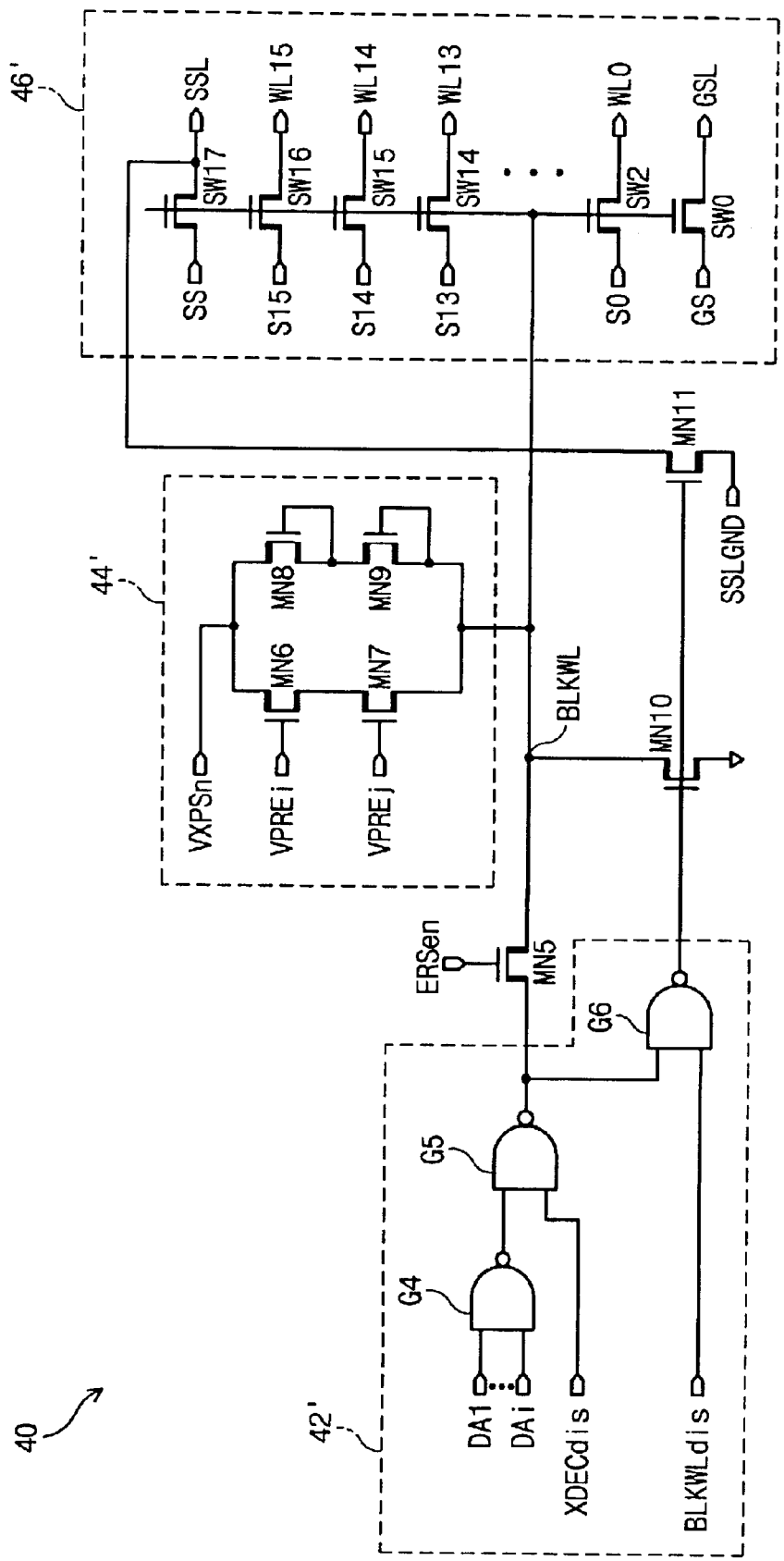
FIG. 3 shows another example of the row selection circuit shown in FIG. 1.

A high voltage VPXPSn−Vtn is sufficient for an approach using a direct precharge scheme (a technique applied to a block decoder shown in FIG. 3). On the other hand, a block decoder according to the embodiments of the invention charges a block wordline BLKWL to a high voltage V3 without a threshold voltage drop using a multi-boosting scheme. Therefore, in a high voltage generation circuit of the block decoder, a high voltage must be applied which is lower, by a threshold voltage Vtn, than a high voltage used in the block decoder shown in FIG. 3. This means that a size of a charge pump used in the high voltage generation circuit 150 is slightly reduced. Further, a voltage of a block wordline BLKWL may be boosted by more controlling a coupling ratio that is necessary for a boosting operation.

Using the block decoder according to embodiments of the invention, a highly integrated device may be more easily formed than compared to the block decoder shown in FIG. 3. In a case that a memory cell array includes a plurality of memory blocks, the block decoder structure shown in FIG. 3 needs a number of switch pump circuits (e.g., dozens of switch pump circuits) decided by address coding for receiving high voltages VPREi and VPREj from a high voltage generation circuit. On the other hand, the block decoder according to embodiments of the invention needs only two switch pump circuits for receiving high voltages VPP1, VPP2, and VPP3 from a high voltage generation circuit. In the block decoder structure shown in FIG. 3, because a heavily loaded block wordline BLKWL is directly precharged, block wordlines BLKWL of all the memory blocks cannot be activated at the same time. Further, because a part of the memory blocks (e.g., dozens of the memory blocks) must be selected according to the address coding, many switch pump for address coding are needed. On the other hand, according to embodiments of the present invention, a lightly loaded node ND1 is precharged in all the memory blocks using a multi-boosting scheme, and then a block wordline BLKWL is boosted in only one selected memory block. Therefore, the block decoder according to embodiments of the invention needs two switch pumps for switching the high voltages VPP2 and VPP3 without address coding. As described above, the high voltage VPP1 is not switched, so that it does not need a switch pump. This means that the NAND flash memory device according to the invention is still more advantageous to be highly integrated.

In addition, since only one bock wordline BLKWL is selected using the multi-boosting scheme, the high voltage generation circuit according to embodiments of the invention sees a relatively lower loading capacitance in comparison with the block decoder structure shown in FIG. 3. Most loading capacitance is occupied with a block wordline BLKWL coupled to a gate of a pass transistor. The high voltage generation circuit according to embodiments of the invention sees only a capacitance of a block wordline of a selected memory block, while the block decoder structure shown in FIG. 3 sees a capacitance of block wordlines of memory blocks (e.g., dozens of memory blocks or more) of any selected group. Therefore, the high voltage generation circuit according to embodiments of the invention sees a relatively lower loading capacitance in comparison with the block decoder structure shown in FIG. 3.

Figure 8:
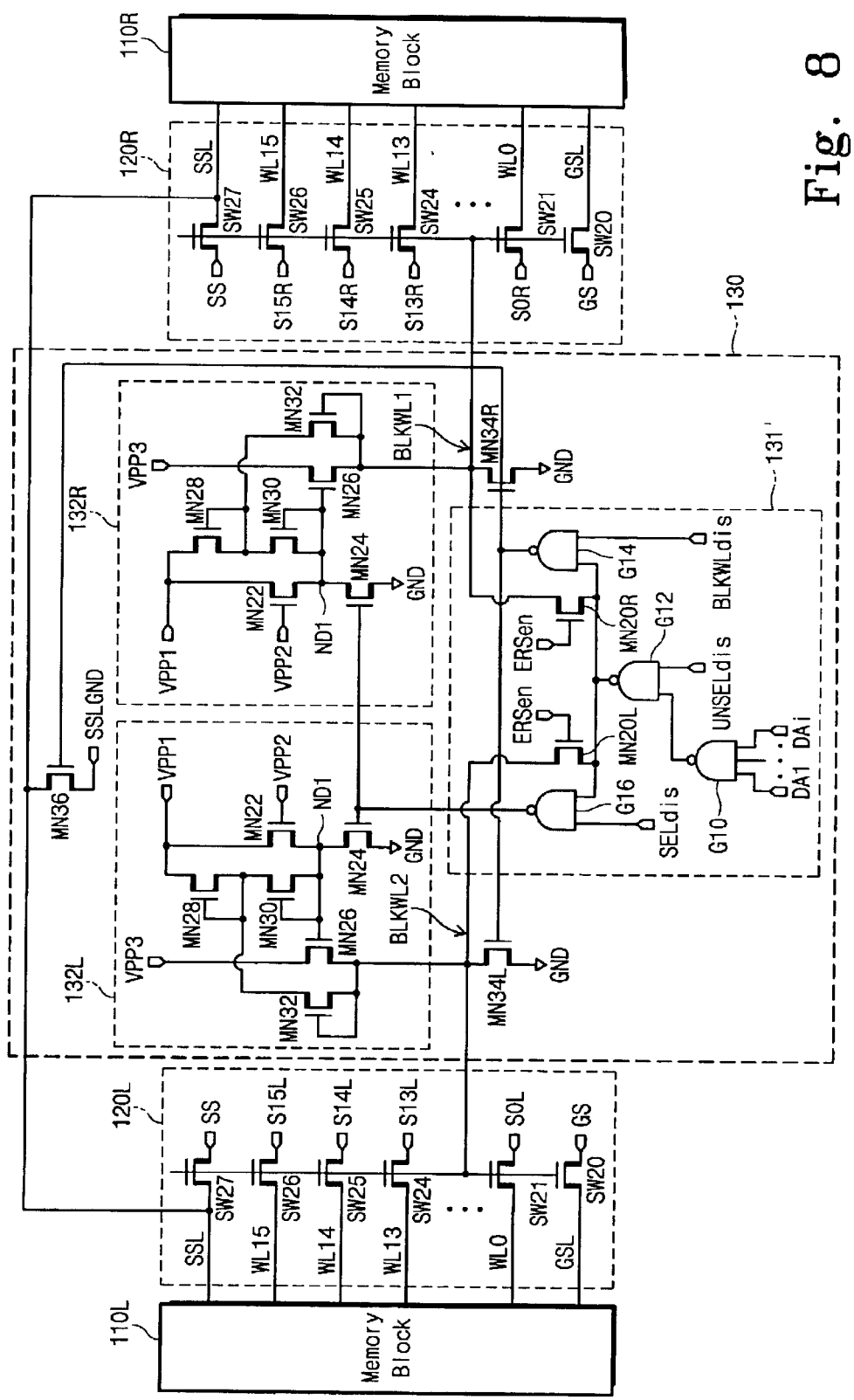
FIG. 8 shows a NAND flash memory device according to another embodiment of the present invention.

A block diagram of a NAND flash memory device according to another embodiment of the invention is illustrated in FIG. 8.

Referring to FIG. 8, this embodiment is different from the first embodiment in that a block wordline is divided into first and second block wordlines BLKWL1 and BLKWL2. A NAND flash memory device according to this embodiment includes components of the memory device according to the first embodiment. The block wordlines BLKWL1 and BLKWL2 are electrically isolated from each other. The first block wordline BLKWL1 is commonly connected to pass transistors SW0–SW27 of a first wordline switch block 120R, and the second block wordline BLKWL2 is commonly connected to pass transistors SW0–SW27 of a second wordline switch block 120L. An NMOS transistor MN34R for discharge and a first precharge block 132R are coupled to the first block wordline BLKWL1. An NMOS transistor MN34L for discharge and a second precharge block 132L are coupled to the second block wordline BLKWL2. Each of the first and second precharge blocks 132R and 132L is substantially identical to the precharge block shown in FIG. 5 and will not be explained in further detail.

A decoding block 131' includes NAND gates G10–G16 and NMOS transistors MN20R and MN20L. The NAND gates G10–G16 are substantially identical to components of FIG. 5 and will not be explained in further detail. Since the block wordline line is divided, the MMOS transistors MN20R and MN20L are connected between the divided block wordlines BLKWL1 and BLKWL2 and an output terminal of the NAND gate G12, respectively. The first wordline switch block 120R receives selection signals S15R–S0R outputted from the switch circuit 190 shown in FIG. 6, and the second wordline switch block 120L receives selection signals S15L–S0L outputted therefrom. This operation is carried out by the same manner as described above. Namely, one of first and second memory blocks 110R and 110L is selected or both of them are selected at the same time. Except the circuit construction difference, row selection circuits 120R, 120L, and 130 operate the same as shown in FIG. 5 and will not be explained in further detail. For the reference, the block wordlines BLKWL1 and BLKWL2 are simultaneously precharged to a high voltage VPP3. However, because the selection signals S0L–S15L are not applied to the second wordline switch block 120L, a shared version of the memory block 110L is not influenced by a program/read operation thereof.

Figure 9:
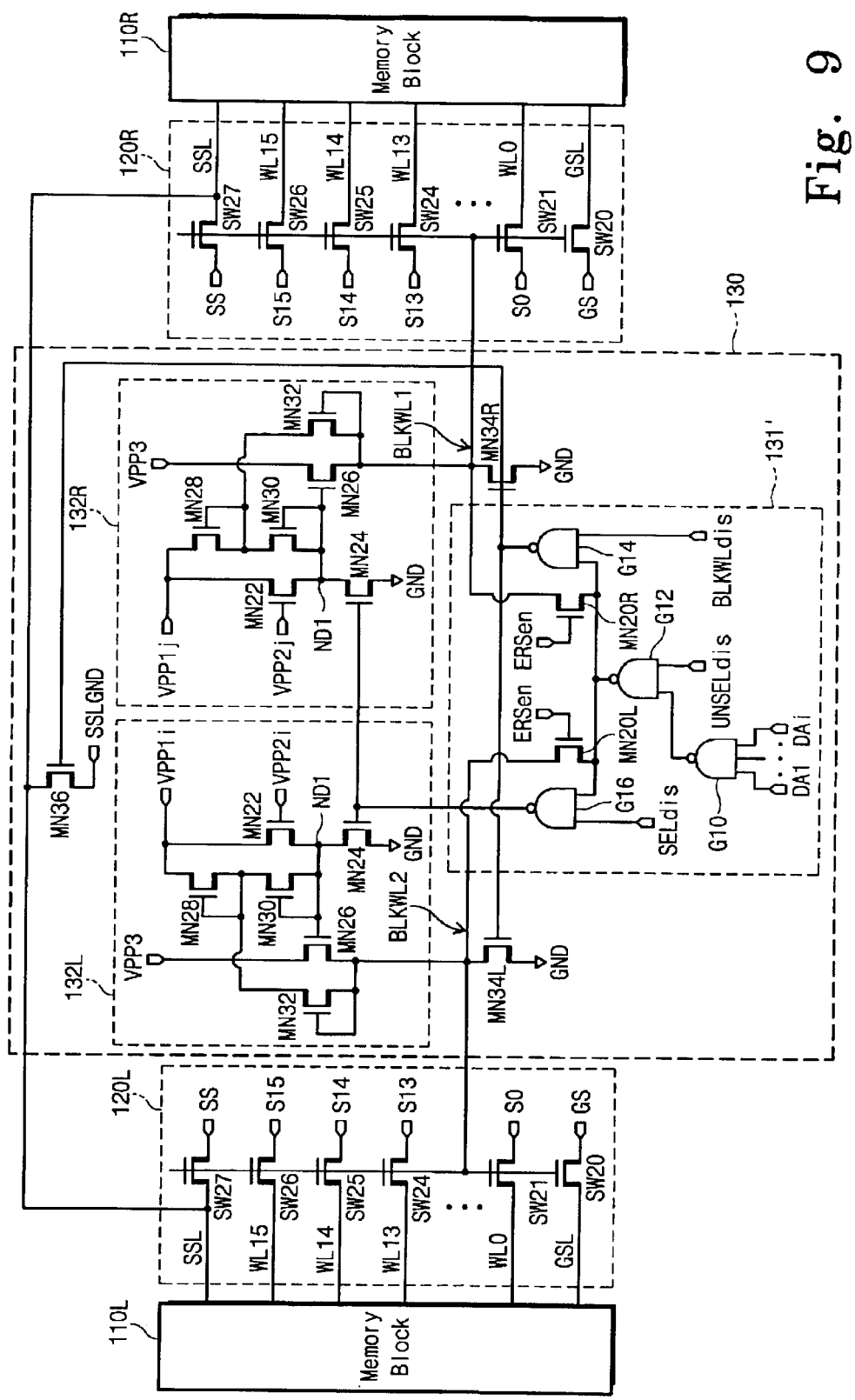
FIG. 9 through FIG. 11 show another examples of a block decoder shown in FIG. 8.
Figure 10:
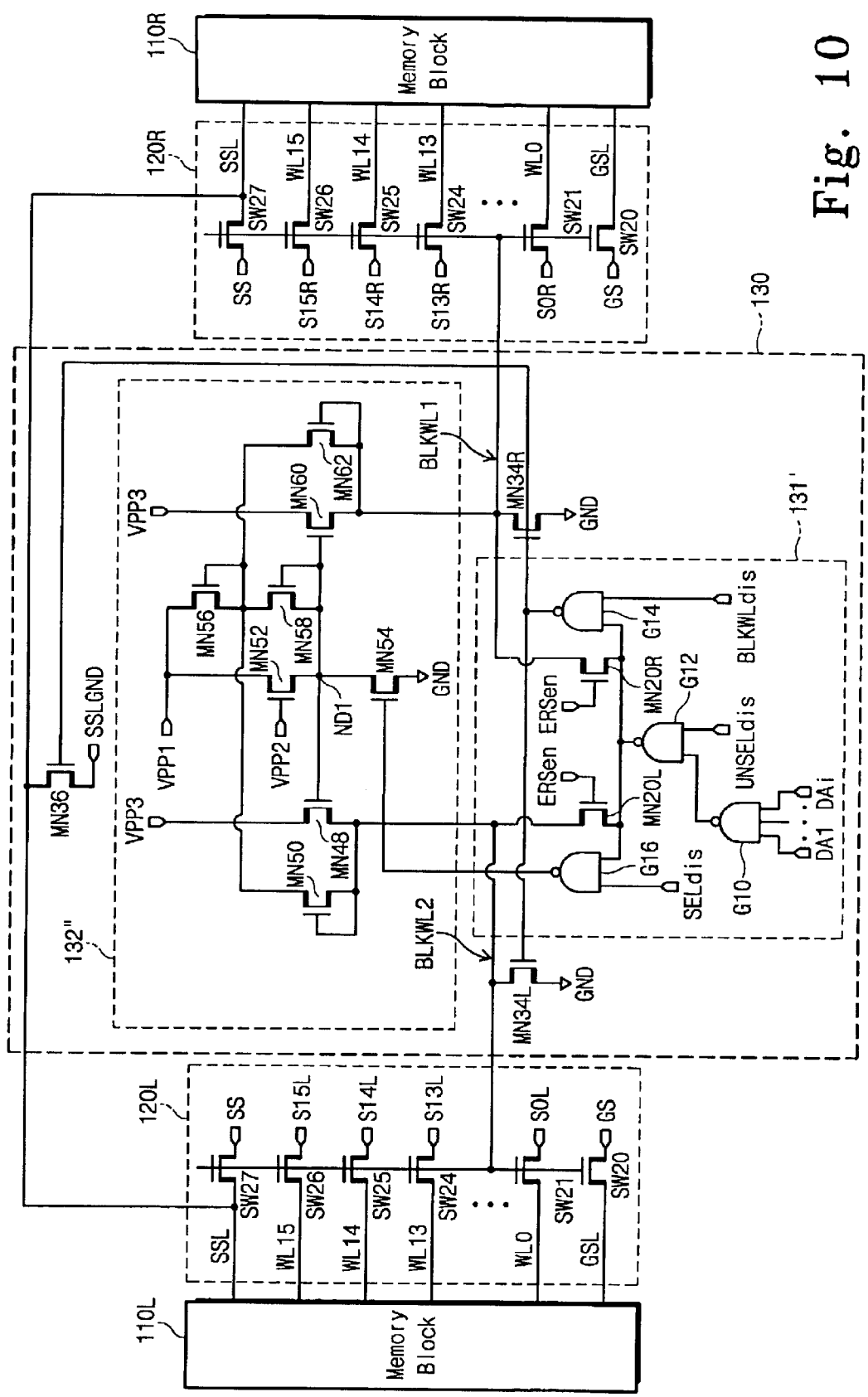
Figure 11:
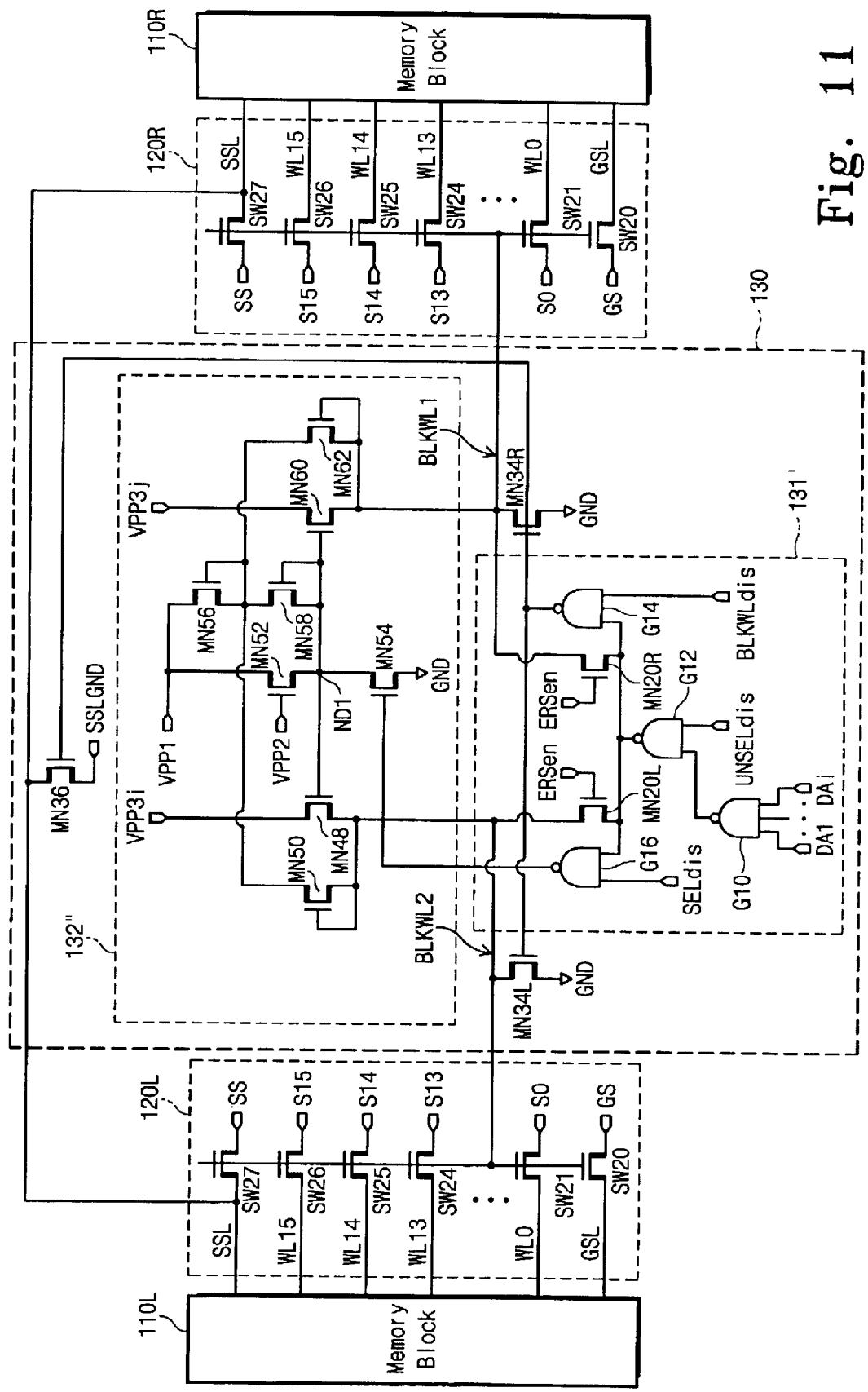

Modified embodiments of the block decoder of FIG. 8 are illustrated in FIG. 9 through FIG. 11.

A block decoder 130 of FIG. 9 is identical to the block decoder of FIG. 8 in that high voltages VPP1 and VPP2 are controlled to be applied selectively or simultaneously according to a mat address. In the above block decoder structure, a high voltage is applied to only one block wordline. Unlike as shown in FIG. 8, selection signals S0–S15 from a predecoder 140 are directly provided to first and second switch blocks 120R and 120L. Like as shown in FIG. 8, divided selection signals may be individually provided to the first and second switch blocks 120R and 120L.

Except that a precharge block 132 of a block decoder of FIG. 10 is different from a precharge block of the block decoder of FIG. 8, the block decoder of FIG. 10 is substantially identical to the block decoder of FIG. 8 and will not be explained in further detail. A precharge block 132" includes NMOS transistors MN48–MN62 that are connected as shown in the figure. The precharge block 132" is constructed to share a first-boosted ND1 node. Basic operation principle is identical to that of the above-described embodiments. Like as shown in FIG. 8, different selection signals S0R–S15R and S0L–S15L are provided to the first and second switch blocks 120R and 120L.

Except that a high voltage VPP3 is controlled to be applied selectively or simultaneously in accordance with a mat address, a block decoder 130 of FIG. 11 is identical to the block decoder of FIG. 10. In this case, unlike as shown in FIG. 10, selection signals S0–S15 from a predecoder 140 are directly provided to first and second switch blocks 120R and 120L. However, like as shown in FIG. 8, divided selection signals may be individually provided to the first and second switch blocks 120R and 120L.

While an illustrative embodiment of the present invention has been shown and described, numerous variations and alternate embodiments will occur to those skilled in the art, without departing from the spirit and scope of the invention. Accordingly, it is intended that the present invention not be limited solely to the specifically described illustrative embodiment. Various modifications are contemplated and can be made without departing from the spirit and scope of the invention as defined by the appended claims.

What is claimed is:

1. A NAND flash memory device comprising:

first and second memory blocks each including a plurality of strings, each of the strings including a first selection transistor coupled to a first selection line, a second selection transistor coupled to a second selection line, and memory cells serially connected between the first and second selection transistors, the memory cells each being coupled to corresponding wordlines, respectively;

a logic circuit for generating a block selection signal in response to block selection information;

a precharge circuit for receiving first high, second high, and third high voltages and for charging a block wordline to the third high voltage without voltage drop when the block selection signal is activated;

a control transistor turned off when the block selection signal is activated, the control transistor being commonly connected to first selection lines of the first and second memory blocks;

a first switch circuit for transferring a first group of selection signals to wordlines of the first memory block, the first switch circuit being coupled to the block wordline and the first switch circuit including a plurality of first pass transistors having gates commonly connected to the block wordline; and a second switch circuit for transferring a second group of selection signals to wordlines of the second memory block, the second switch circuit being coupled to the block wordline, and the second switch circuit including a plurality of second pass transistors having gates commonly connected to the block wordline.

2. The NAND flash memory device as recited in claim 1, further comprising a discharge transistor for discharging a voltage of the block wordline when the block selection signal is inactivated.

3. The NAND flash memory device as recited in claim 1, wherein the precharge circuit comprises:

an internal node;

a first switch for precharging the internal node according to the second high voltage, the first switch being connected between the first high voltage and the internal node; and a second switch for transferring the third high voltage to the block wordline according to a voltage of the internal node, the second switch being connected between the third high voltage and the block wordline, wherein the block wordline is structured to be precharged in a multi-boosting manner.

4. The NAND flash memory device as recited in claim 3, wherein the multi-boosting manner comprises:

precharging the internal node using the first high voltage;

floating the precharge internal node; and applying the third high voltage to the second switch to cause a boost of a voltage of the internal node.

5. The NAND flash memory device as recited in claim 1, wherein, when the first memory block is selected, the first switch circuit is structured to transfer the first group of the selection signals to the wordlines of the first memory block.

6. The NAND flash memory device as recited in claim 1, wherein when the second memory block is selected, the second switch circuit is structured to transfer the second group of the selection signals to the wordlines of the second memory block.

7. The NAND flash memory device as recited in claim 1, wherein when the first and second memory blocks are selected at the same time, the first switch circuit is structured to transfer the first group of the selection signals to the wordlines of the first memory block and the second switch circuit is structured to transfer the second group of the selection signals to the wordlines of the second memory block.

8. A NAND flash memory device comprising:

first and second memory blocks each including a plurality of strings, each of the strings including a first selection transistor coupled to a first selection line, a second selection transistor coupled to a second selection line, and memory cells serially connected between the first and second selection transistors, the memory cells each being coupled to corresponding wordlines, respectively;

a logic circuit for generating a block selection signal in response to block selection information;

a precharge circuit for receiving a first high, a second high, and a third high voltage and for charging first and second block wordlines, electrically isolated from each other, to the third high voltage without voltage drop when the block selection signal is activated;

a control transistor structured to be turned off when the block selection signal is activated, the control transistor being commonly connected to first selection lines of the first and second memory blocks;

a first switch circuit for transferring a first group of selection signals to wordlines of the first memory block, the first switch circuit being coupled to the block wordline and the first switch circuit including a plurality of first pass transistors having gates commonly connected to the block wordline; and a second switch circuit for transferring a second group of selection signals to wordlines of the second memory block, the second switch circuit being coupled to the block wordline, and the second switch circuit including a plurality of second pass transistors having gates commonly connected to the block wordline.

9. The NAND flash memory device as recited in claim 8, further comprising:

a first discharge transistor for discharging a voltage of the first block wordline when the block selection signal is inactivated; and a second discharge transistor for discharging a voltage of the second block wordline when the block selection signal is inactivated.

10. The NAND flash memory device as recited in claim 8, wherein the precharge circuit includes first and second precharge blocks, each precharge block including:

an internal node;

a first switch for precharging the internal node according to the second high voltage, the first switch being connected between the first high voltage and the internal node; and a second switch for transferring the third voltage to the block wordline according to a voltage of the internal node, the second switch being connected between the third high voltage and the block wordline, wherein the block wordline is structured to be precharged in a multi-boosting manner.

11. The NAND flash memory device as recited in claim 10, wherein the multi-boosting manner comprises:

precharging the internal node using the first high voltage;

floating the precharge internal node; and applying the third high voltage to the second switch to cause a boost of a voltage of the internal node.

12. The NAND flash memory device as recited in claim 8, wherein, when the first memory block is selected, the first switch circuit is structured to transfer the first group of the selection signals to the wordlines of the first memory block.

13. The NAND flash memory device as recited in claim 8, wherein when the second memory block is selected, the second switch circuit is structured to transfer the second group of the selection signals to the wordlines of the second memory block.

14. The NAND flash memory device as recited in claim 8, wherein when the first and second memory blocks are selected at the same time, the first switch circuit is structured to transfer the first group of the selection signals to the wordlines of the first memory block and the second switch circuit is structured to transfer the second group of the selection signals to the wordlines of the second memory block.

15. A NAND flash memory device including first and second mats each having a plurality of memory blocks, wherein each of the memory blocks includes a first selection transistor coupled to a first selection line, a second selection transistor coupled to a second selection line, and memory cells serially connected between the first and second selection lines, the memory cells being respectively coupled to corresponding wordlines, the NAND flash memory device comprising:

a row selection circuit including a plurality of row selectors each corresponding to respective memory blocks of the first and second mats;

a mat selection circuit for generating first and second mat selection signals each corresponding to the first and second mats in response to mat selection information;

a predecoder circuit for generating wordline selection signals in response to wordline selection information; and a transfer circuit for receiving the wordline selection signals and outputting first and second selection signals in response to the first and second mat selection signals, wherein each of the row selectors is shared by corresponding memory blocks of the first and second mats, and each of the row selectors includes:

a logic circuit for generating a block selection signal in response to block selection information, a precharge circuit for receiving first, second and third high voltages and for charging a block wordline to the third high voltage without voltage drop when the block selection signal is activated, a control transistor structured to be turned off when the block selection signal is activated, the control transistor being commonly coupled to first selection lines of the first and second memory blocks, a first switch circuit for transferring a first group of selection signals to wordlines of the first memory block, the first switch circuit being coupled to the block wordline, and the first switch circuit including a plurality of first pass transistors having gates commonly connected to the block wordline, and a second switch circuit for transferring a second group of selection signals to wordlines of the second memory block, the second switch circuit being coupled to the block wordline, and the second switch circuit including a plurality of second pass transistors having gates commonly connected to the block wordline.

16. The NAND flash memory device as recited in claim 15, further comprising a discharge transistor structured to discharge a voltage of the block wordline when the block selection signal is inactivated.

17. The NAND flash memory device as recited in claim 15, wherein the precharge circuit includes:

an internal node;

a first switch for precharging the internal node according to the second high voltage, the first switch being connected between the first high voltage and the internal node; and a second switch for transferring the third high voltage to the block wordline according to a voltage of the internal node, the second switch being connected between the third high voltage and the block wordline, wherein the block wordline is structured to be precharged in a multi-boosting manner.

18. The NAND flash memory device as recited in claim 17, wherein the multi-boosting manner comprises:

precharging the internal node using the first high voltage;

floating the precharged internal node; and applying the third high voltage to the second switch to cause a voltage boost of the floated internal node.

19. The NAND flash memory device as recited in claim 15, wherein when the first mat is selected, the first switch circuit is structured to transfer the first group of the selection signals to wordlines of a selected memory block of the first mat.

20. The NAND flash memory device as recited in claim 15, wherein when the second mat is selected, the second switch circuit is structured to transfer the second group of the selection signals to wordlines of a selected memory block of the second mat.

21. The NAND flash memory device as recited in claim 15, wherein when the first and second mats are selected at the same time, the first switch circuit is structured to transfer the first group of the selection signals to wordlines of a selected memory block of the first mat and the second switch circuit is structured to transfer the second group of the selection signals to wordlines of a selected memory block of the second mat.

22. A NAND flash memory device including first and second mats each having a plurality of memory blocks, wherein each of the memory blocks includes a first selection transistor coupled to a first selection line, a second selection transistor coupled to a second selection line, and memory cells serially connected between the first and second selection lines, the memory cells respectively coupled to corresponding wordlines, the NAND flash memory device comprising:

a row selection circuit including a plurality of row selectors each corresponding to respective memory blocks of the first and second mats;

a mat selection circuit for generating first and second mat selection signals each corresponding to the first and second mats in response to mat selection information;

a predecoder circuit for generating wordline selection signals in response to wordline selection information; and a transfer circuit for receiving the wordline selection signals and outputting first and second selection signals in response to the first and second mat selection signals, wherein each of the row selectors is shared by corresponding memory blocks of the first and second mats, and each of the row selectors includes:

a logic circuit for generating a block selection signal in response to block selection information, a precharge circuit for receiving first high, second high, and third high voltages, and for charging first and second block wordlines, electrically isolated from each other, to the third high voltage without voltage drop when the block selection signal is activated, a control transistor structured to be turned off when the block selection signal is activated, the control transistor being commonly connected to first selection lines of the first and second memory blocks, a first switch circuit for transferring a first group of selection signals to wordlines of the first memory block, the first switch circuit being coupled to the block wordline, and the first switch circuit including a plurality of first pass transistors having gates commonly connected to the block wordline, and a second switch circuit for transferring a second group of selection signals to wordlines of the second memory block, the second switch circuit being coupled to the block wordline, and the second switch circuit including a plurality of second pass transistors having gates commonly connected to the block wordline.

23. The NAND flash memory device as recited in claim 22, further comprising:

a first discharge transistor for discharging a voltage of the first block wordline when the block selection signal is inactivated; and a second discharge transistor for discharging a voltage of the second block wordline when the block selection signal is inactivated.

24. The NAND flash memory device as recited in claim 22, wherein the precharge circuit is structured to precharge the block wordlines in a multi-boosting manner.

25. The NAND flash memory device as recited in claim 22, wherein when the first mat is selected, the first switch circuit is structured to transfer the first group of the selection signals to wordlines of a selected memory block of the first mat.

26. The NAND flash memory device as recited in claim 22, wherein when the second mat is selected, the second switch circuit is structured to transfer the second group of the selection signals to wordlines of a selected memory block of the second mat.

27. The NAND flash memory device as recited in claim 22, wherein when the first and second mats are selected at the same time, the first switch circuit is structured to transfer the first group of the selection signals to wordlines of a selected memory block of the first mat and the second switch circuit is structured to transfer the second group of the selection signals to wordlines of a selected memory block of the second mat, and the selected memory blocks share a corresponding selector.

28. A NAND flash memory device including first and second mats each having a plurality of memory blocks, wherein each of the memory blocks includes a first transistor coupled to a first selection line, a second selection transistor coupled to a second selection line, and a plurality of strings serially connected between the first and second selection transistors, the strings being respectively coupled to wordlines, the NAND flash memory device comprising:

a row selection circuit including a plurality of row selectors each corresponding to respective memory blocks of the first and second mats;

a mat selection circuit for generating first and second mat selection signals each corresponding to the first and second mats in response to mat selection information;

a predecoder circuit for generating wordline selection signals in response to wordline selection information; and a transfer circuit for receiving the wordline selection signals and outputting first and second selection signals in response to the first and second mat selection signals, wherein each of the row selectors is shared by corresponding memory blocks of the first and second mats, and each of the row selectors includes:

a logic circuit for generating a block selection signal in response to block selection information, a precharge circuit for receiving first, second and third high voltages, and for charging one of first and second block wordlines, electrically isolated from each other, to the third high voltage without voltage drop when the block selection signal is activated;

a control transistor structured to be turned off when the block selection signal is activated, the control transistor being commonly connected to first selection lines of the first and second memory blocks, a first switch circuit for transferring a first group of selection signals to wordlines of the first memory block when the first block wordline is activated, the first switch circuit being coupled to the block wordline, and the first switch circuit including a plurality of first pass transistors having gates commonly connected to the block wordline, and a second switch circuit for transferring a second group of selection signals to wordlines of the second memory block when the second block wordline is activated, the second switch circuit being coupled to the block wordline, and the second switch circuit including a plurality of second pass transistors having gates commonly connected to the block wordline.

29. The NAND flash memory device as recited in claim 28, further comprising:

a first discharge transistor for discharging a voltage of the first block wordline when the block selection signal is inactivated; and a second discharge transistor for discharging a voltage of the second block wordline when the block selection signal is inactivated.

30. The NAND flash memory device as recited in claim 28, wherein the precharge circuit is structured to precharge one of the first and second block wordlines by using multi-boosting.

* * * * *

UNITED STATES PATENT AND TRADEMARK OFFICE
CERTIFICATE OF CORRECTION

PATENT NO. : 6,731,540 B2
DATED : May 4, 2004
INVENTOR(S) : Lee et al.

It is certified that error appears in the above-identified patent and that said Letters Patent is hereby corrected as shown below:

Column 2,
Line 34, "transistors SW1-SW0 each" should read -- transistors SW17-SW0 each --.

Signed and Sealed this

Fourteenth Day of December, 2004

JON W. DUDAS
*Director of the United States Patent and Trademark Office*